US006076543A

United States Patent [19]
Johnson

[11] Patent Number: 6,076,543

[45] Date of Patent: Jun. 20, 2000

[54] GAS HANDLING DEVICE

[75] Inventor: Paul W. Johnson, Pleasanton, Calif.

[73] Assignee: United States Filter Corporation, Palm Desert, Calif.

[21] Appl. No.: 08/965,077

[22] Filed: Nov. 6, 1997

[51] Int. Cl.[7] .......... F16L 03/00

[52] U.S. Cl. .......... 137/15; 137/269; 137/382; 137/883; 137/884

[58] Field of Search .......... 137/269, 270, 137/377, 382, 883, 884, 15

[56] References Cited

U.S. PATENT DOCUMENTS

| | | | |
|---|---|---|---|
| 3,698,432 | 10/1972 | Kutz | 137/271 |
| 4,082,324 | 4/1978 | Obrecht | 137/271 |
| 4,498,693 | 2/1985 | Schindele | 285/137 |
| 4,865,358 | 9/1989 | Jokinen | 285/64 |
| 5,025,834 | 6/1991 | Stoll | 137/271 |
| 5,421,383 | 6/1995 | Schmid | 141/232 |
| 5,488,925 | 2/1996 | Kumada | 118/715 |
| 5,529,088 | 6/1996 | Asou | 137/271 |
| 5,553,892 | 9/1996 | Pitchford et al. | 285/12 |
| 5,662,143 | 9/1997 | Caughran | 137/269 |
| 5,699,834 | 12/1997 | Hayashi et al. | 137/271 |
| 5,915,414 | 6/1999 | Seaman et al. | 137/377 |

*Primary Examiner*—A. Michael Chambers
*Attorney, Agent, or Firm*—Wolf, Greenfield & Sacks, P.C.

[57] ABSTRACT

The invention achieves these and other objects by providing a gas handling device that includes an elongate track having a pair of laterally spaced and longitudinally extending channels extending generally along the length of the track. The device further includes a plurality of gas handling units which are slidably mounted along the length of the track and selectively securable thereon without requiring alteration to the track or the units. Spool pieces and supports therefor are coupled to the first and last gas handling unit mounted on the track to establish communication with field tubing to deliver and remove a flow of process gas to and from the gas handling units. A method for mounting gas handling units on the device is also disclosed.

37 Claims, 4 Drawing Sheets

10
12
14
16
20
22
24
26
28
30
32
34

40
42
44
45
46
47
48
50
51
52
52'
54
55
56
57
58
62
62'
76
77
7
9

Fig. 3
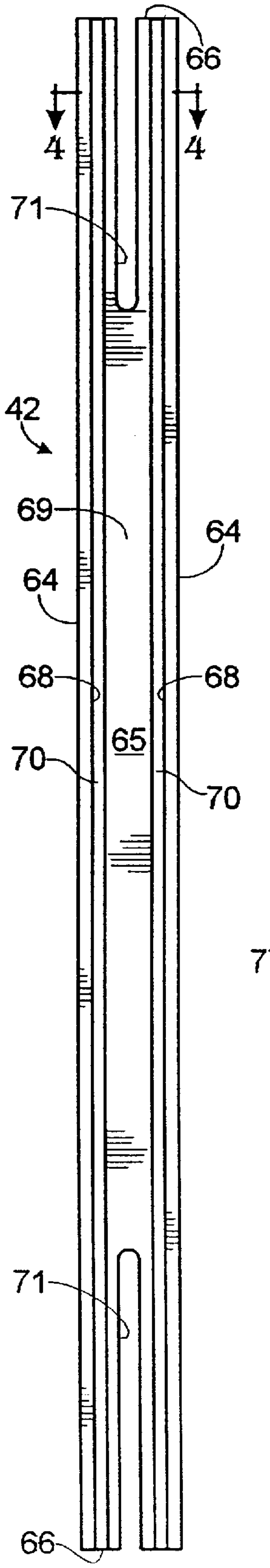
Fig. 4
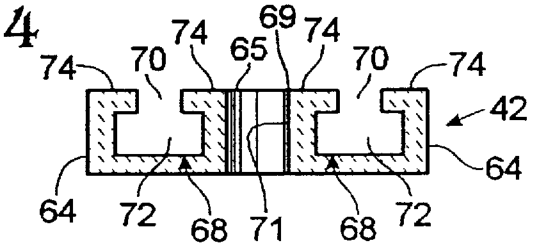
Fig. 6
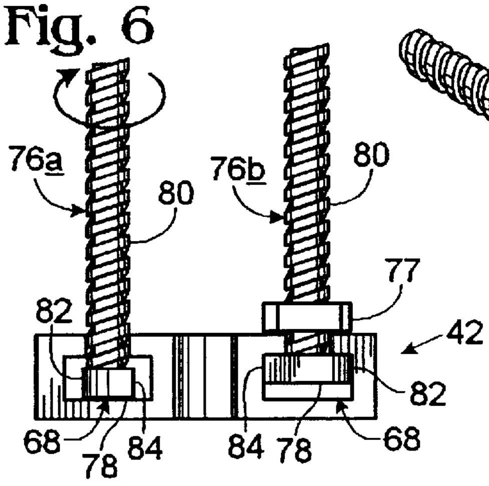
Fig. 5
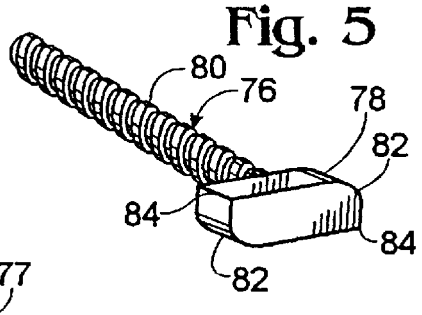
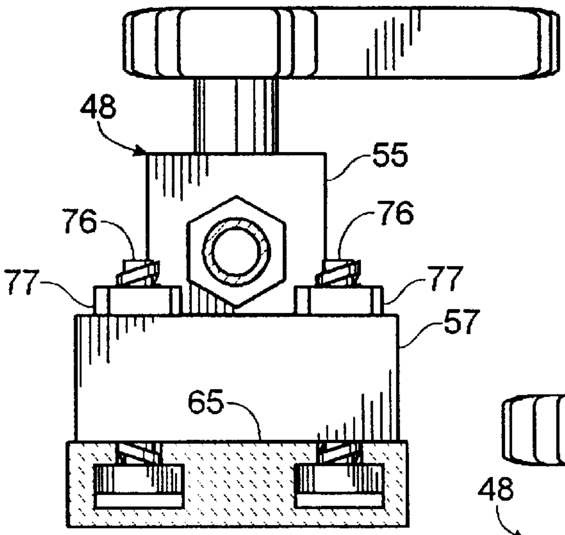
Fig. 7
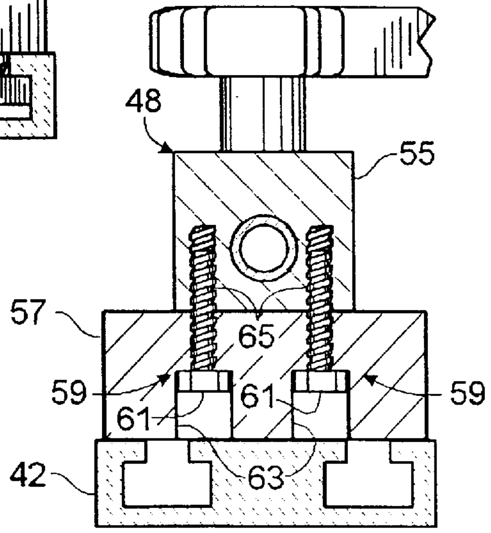
Fig. 8
66
4
4
71
42
69
64
64
68
68
65
70
70
71
66
74
70
74
65
69
74
70
74
42
64
64
72
68
71
68
72
76a
80
76b
80
77
82
42
82
68
78
84
84
78
68
80
76
78
82
84
84
82
48
55
76
76
77
77
57
65
48
55
57
65
59
61
61
59
61
63
42

GAS HANDLING DEVICE

FIELD OF THE INVENTION

The present invention relates generally to gas handling devices, and more particularly to a gas handling device that provides an adjustable support for a plurality of gas handling units.

BACKGROUND OF THE INVENTION

In a semiconductor manufacturing process, a variety of tools are utilized, such as steppers, etchers and the like, each of which requires a constant supply of process gases in order to produce semiconductor devices of uniform quality. A tool may require multiple supply lines of both inert and volatile process gases, such as nitrogen, oxygen, hydrogen, xylene, boron trichloride, silicon trifluoride, argon, etc. Many process gases are flammable, toxic and/or pyrophoric and therefore require special precautions in order to be utilized safely.

A conventional gas handling device is shown in FIG. 1 and indicated generally at 10. Device 10 includes a plurality of gas handling units, including a pair of stop valves 12, a mass flow controller 14 and a filter 16. The units each have inlet and exit ports that are sequentially coupled together by fittings 20. A gas supply (not shown) delivers a flow of process gas to the device's inlet 22, and the device's outlet 24 is coupled to the tool via another length of tubing. To stabilize and support the devices, valves 12 and controller 14 include a mounting block 26, which includes a pair of legs 28 with outwardly extending lower portions 30 that are rigidly secured on a base plate 32, such as an elongate sheet of stainless steel. To secure each mounting block 26 to plate 32, holes are drilled in precise locations on the plate and bolts 34, or other suitable fasteners, are passed through the holes and outwardly extending portions 30 of the blocks to secure the gas handling units in a fixed position on the plate, thereby supporting the gas handling device thereon.

The above-described gas handling device has numerous disadvantages, including, but not limited to, the following:

A primary disadvantage of the gas handling device shown in FIG. 1 is its lack of adjustability. Because units such as valves and pressure transducers are mounted in a fixed position on base plate 32 through holes that are drilled or punched through the base when the units are initially installed thereon, additional units can not be easily added to the device. Specifically, to install an additional gas handling unit to the device shown in FIG. 1, the individual gas handling units must be removed from plate 32 and further spaced apart from each other. Because the addition of the new unit will increase the length of device 10 and change the position of the individual mounting surfaces of the previously mounted gas handling units, new holes must be punched or drilled into plate 32 for the new unit, as well as any displaced old units. This process is not only very time and labor intensive, but also significantly increases the possibility that particulate and other contaminants will be introduced to the gas handling device, as well as to the tool with which the device is used.

It should be understood that the tools, namely the semiconductor processing machines or devices, used in the semiconductor manufacturing process are conventionally housed in a clean room in order to prevent dust, small particulate and other contaminants from being introduced to the gas handling units, the tools and any products made therefrom. Therefore, when multiple holes must be drilled in the stainless steel base plate, there is a significant chance that small shavings, dirt and other contaminants will be created and potentially introduced to the gas handling device or tool. This is true even if the drill used to make the new mounting holes has some form of vacuum or contaminant-trapping mechanism.

Similar to the above discussed problem, the gas handling device shown in FIG. 1 presents other problems relating to adjustability that are encountered when an existing gas handling unit must be replaced. The simplest form of replacement is to remove an existing unit, such as flow controller 14, and replace it with an identical unit. The danger in this replacement is that the sealing surfaces of the unit's inlet and outlet ports may become scratched or damaged because of insufficient clearance between the sealing surface of the flow controller's inlet and outlet ports and the sealing end of fitting 20, which connects the flow controller to adjacent units. In order to prevent the sealing surface of controller 14 from being scratched or damaged, other gas handling units, such as valve 12 or filter 16 must be loosened to provide clearances between the inlet and outlet port of the controller and the respective fittings 20. Therefore, instead of being able to quickly remove and replace an existing unit with an identical replacement unit, the process requires manipulation of multiple units and therefore takes a considerable amount of time and effort.

Even more time and labor intensive problems are caused when an existing unit must be replaced with a unit of a different size. This situation often results in the semiconductor manufacturing process when an existing unit is discontinued by its manufacturer or when a user desires to upgrade or change a particular unit. When this occurs, the existing unit must be removed, and the new unit replaced therefor. Because gas handling units tend to vary in size, shape, and height, this process generally requires the gas handling units on either side of the new unit to be removed and remounted on base plate 32. As discussed above, this involves removing existing units, drilling new holes and remounting the removed units.

An additional problem with existing gas handling devices is that they cannot be quickly removed from the tool with which they are used. Specifically, a particular tool in the semiconductor manufacturing process may use as few as one and as many as eighteen or more gas handling devices to deliver process gas to the tool. If any of the individual gas handling units on any of these gas handling devices fails, the tool must be shut down until the problem is identified and repaired. It should be understood that in addition to the labor, time and materials cost to identify and repair the faulty unit, the user faces even greater losses from the lack of use of the tool during this repair and maintenance period, which can commonly take from several hours to several days.

Once the tool is "brought down" or stopped, the faulty gas handling device must be identified, and the individual gas handling units on the device must be removed, tested, replaced if faulty, and remounted on the device. Furthermore, if the faulty unit is not currently on hand or readily available, the down time problem is extended until another unit may be obtained, or alternatively, the above-discussed problem encountered when new units are used to replace older or less available units is revisited.

An additional problem with conventional gas handling devices is the difficulty a user encounters when gas handling units must be mounted and removed from the device after the device is installed in an operative position to provide process gas to a tool. Specifically, this problem arises because the individual gas handling units are mounted on base plate 32 using a bolt 34 which extends through the unit and the plate and is secured by a nut or other suitable fastener on the underside of plate 32. Therefore, in order to remove and replace a unit, the user must have access to the space beneath plate 32 in order to engage the nut used to fasten the unit, and specifically the bolt, on the plate. In fact, while attempting to gain access to the portion of the fastener between the plate and the tool or other surface on which the plate is mounted, the user is actually prone to damaging other gas handling devices mounted adjacent the device being repaired.

This problem is magnified when the gas handling device is used to deliver a toxic, pyrophoric or other dangerous gas to the tool. Because of the likelihood of injury to users if the gas leaks from the device, the gas handling device is housed in a box that is vented to an external source. The box protects users from being exposed to a harmful gas, but causes the user's working area to be constrained on virtually all sides of the device. As such, it is extremely difficult to access and manipulate nuts or other components which are mounted beneath plate 32.

A further disadvantage of the gas handling device shown in FIG. 1 is that the plate must be mounted in a fixed position on or adjacent to the tool to which it provides a flow of gas. Plate 32 is mounted by drilling holes in selected mounting positions to receive a bolt and nut or other suitable fastening device to secure the device in a fixed operative position. Because it is not known in advance where the exact positioning of the holes must be, the holes must be drilled within the clean room in which the tool is used, thereby creating the risk of particulates and other contaminants being introduced into the gas handling units and the tool, as discussed above.

Yet another disadvantage with the gas handling device shown in FIG. 1 is that it must be assembled and installed on site. Specifically, the dimensions of the device and the span or length available on the device's base plate or other mounting unit are not known to the installer until the installer is present at the tool with which the device is to be used. This is often due to the continually changing or custom configurations of the gas handling units, which are typically available from a variety of suppliers. Therefore, the device must often be assembled manually at the site. This not only increases the time, and hence expense, necessary to install the device, but also significantly increases the risk that particulate or other contaminants will be introduced into the gas handling units. It should be understood that particulate on the micron level in size are sufficient to clog or otherwise cause gas handling units to malfunction or contribute to manufacturing or yield problems.

A related disadvantage of assembling and installing the devices on site is that the installer of piping to the tool does not know the dimensions or space needed for the gas handling device. Accordingly, the person installing the piping is able to route or install piping adjacent the tool, but then must wait until the device is installed before completing the installation. This commonly results in the installer making additional trips to the site, thereby further increasing the cost of installation and the time necessary to get the tool up and running.

With the above problems in mind, it is a general object of the present invention to provide a gas handling device in which the gas handling units mounted thereon are slidably and adjustably mounted with respect to the device and selectively securable thereon.

Another object is to provide such a device with dual laterally spaced and longitudinally extending tracks, each configured to engage a portion of a gas handling unit to retain and stabilize the unit on the device.

Yet another object is to provide a gas handling device which is of a standard length and which may be mass-produced with a plurality of gas handling units mounted thereon.

Still another object is to provide a gas handling device which enables gas handling units to be mounted thereon, adjusted and removed therefrom without requiring the user to access the region beneath the device.

Another object is to provide a gas handling device which may be adjustably mounted for operative use on or adjacent to a tool used in the semiconductor manufacturing process without requiring alteration of the surface on which the tool is mounted.

Yet another object is to provide a method for mounting a plurality of gas handling units on a gas handling device without requiring alteration of the gas handling device.

Still another object is to provide a method for mounting a gas handling device for operative use on or adjacent to a tool used in the semiconductor manufacturing process without requiring alteration of the surface on which the device is mounted.

A further object is to provide a gas handling device that stabilizes the fittings and mechanical joints of the gas handling device without requiring additional field work.

SUMMARY OF THE INVENTION

The invention achieves these and other objects by providing a gas handling device that includes an elongate track having a pair of laterally spaced and longitudinally extending channels extending generally along the length of the track. The device further includes a plurality of gas handling units which are slidably mounted along the length of the track and selectively securable thereon without requiring alteration to the track or the units. Spool pieces and supports therefor are coupled to the first and last gas handling unit mounted on the track to establish communication with field tubing to deliver and remove a flow of process gas to and from the gas handling units.

These and other objects and advantages are obtained by the invention, which is described below in conjunction with the accompanying drawings. Many other features, advantages and additional objects of the present invention will be apparent to those versed in the art upon making reference to the detailed description which follows and the accompanying drawings in which preferred embodiments incorporating the principals of this inventions are disclosed as illustrative examples only.

BRIEF DESCRIPTION OF THE DRAWINGS

FIG. 3 is a top plan view of the track shown in FIG. 2.

FIG. 4 is an enlarged cross-sectional view of the device shown in FIG. 3, taken along the line 4—4 in FIG. 3.

FIG. 5 is an isometric view of a fastener used to mount gas handling devices and supports on the track.

FIG. 6 is the cross-sectional view shown in FIG. 4 with a pair of fasteners received within the track.

FIG. 7 is a cross-sectional view of the device taken along the line 7—7 in FIG. 2 and showing a gas handling unit mounted on the track.

FIG. 8 is a cross-sectional view of the gas handling unit shown in FIG. 7.

DETAILED DESCRIPTION OF THE PREFERRED EMBODIMENTS AND METHOD OF USING THE SAME

Figure 2:
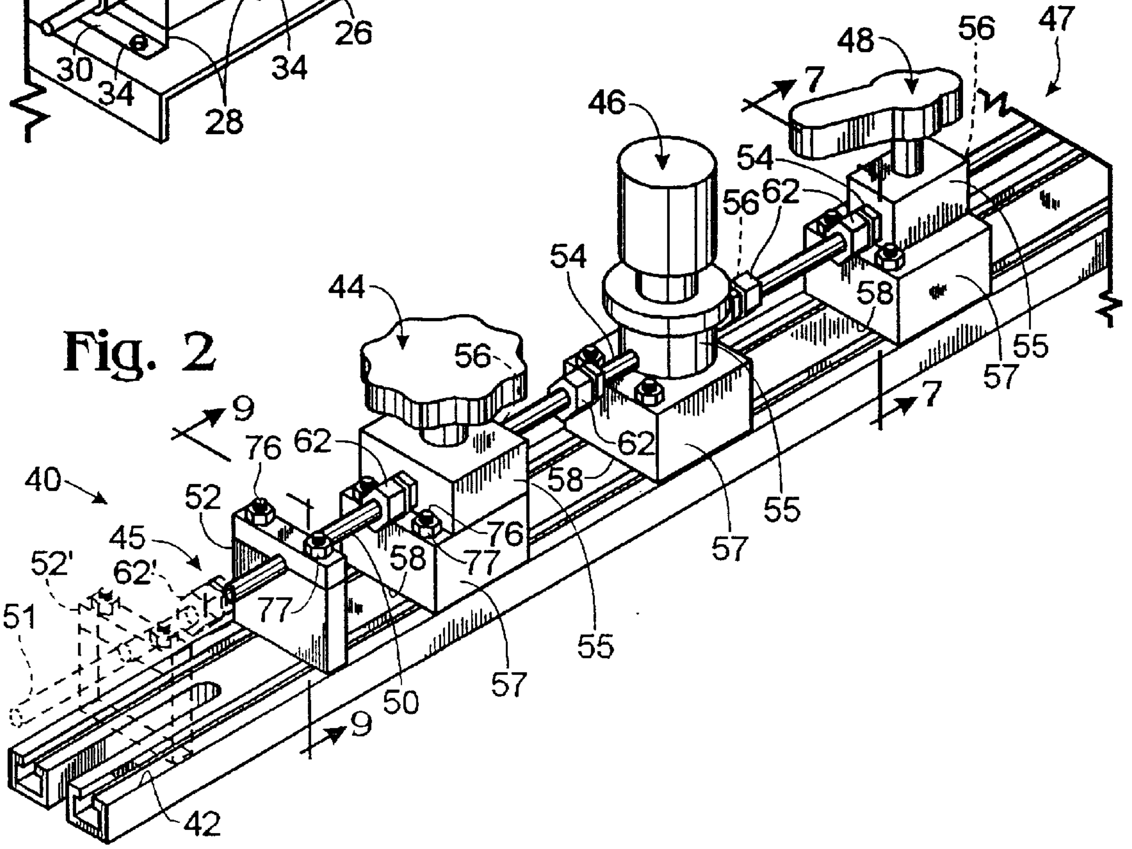
FIG. 2 is an isometric view showing a gas handling device constructed according to a preferred embodiment of the invention. The device includes a track with a pair of laterally spaced and longitudinally extending channels for slidably mounting a plurality of gas handling units and enabling the units to be selectively secured thereon.

A gas handling device constructed according to a preferred embodiment of the invention is shown in FIG. 2 and indicated generally at 40. Device 40 includes an elongate track 42, a plurality of interconnected gas handling units 44–48 mounted on track 42, an inlet port 45 and an exit port 47. As shown, device 40 further includes a spool piece 50, which is coupled to gas handling unit 44. Device 40 also includes a support 52 for supporting and maintaining at least a portion of spool piece 50 in an operative position for delivering or removing a flow of process gas to or from the gas handling units. It should be understood that the ends of gas handling device 10 are preferably symmetrical, in that another spool piece 50 and support 52 are coupled to the gas handling unit at the end of track 42 which is not shown in FIG. 2.

Gas handling units 44–48 are slidably and adjustably mounted on track 42 and are selectively securable thereon. The units regulate and control the flow of process gas prior to its delivery to a semiconductor manufacturing apparatus, namely, one of the previously described tools, or machines, used to produce semiconductor devices. Examples of gas handling devices are pressure regulators, flow controllers, filters, pressure transducers, pressure indicators, and valves, such as stop valves, ball valves and diaphragm valves. A stop valve 44, a pressure regulator 46 and a diaphragm valve 48 are shown in FIG. 2 as illustrative examples of suitable gas handling units. Each unit has an inlet and an exit port 54 and 56, respectively, that extend from opposing sides of each unit's body portion 55. Each gas handling unit further includes a mounting block 57 that has a mounting surface 58 that engages track 42, and which supports body portion 55 at a selected operative position with respect to track 42. It should be understood that the inlet and exit ports 54 and 56 of each gas handling unit generally include a length of tubing, as shown in FIG. 2, to which fitting 62 is coupled to establish communication between the unit and an adjacent gas handling unit, spool piece or field tubing, etc.

The spool, or connector, pieces of tubing are constructed from a suitable material for transporting the particular process gas to be used. An example of a suitable material for most applications is stainless steel, although particularly reactive or corrosive gases may require spool pieces 50 to be formed from a specialized material or otherwise treated for use with the particular gas. For example, toxic or other hazardous or flammable gases may require spool pieces 50 to be jacketed or doubled-walled. Preferably, the lengths of spool pieces 50 are predetermined, so that the overall length of gas handing device 10 is known, as measured between the ends of track 42 and from the ends of field tubing 50 adjacent each end of track 42.

As shown in FIG. 2, spool piece 50 is coupled, via fitting 62', to a length of field tubing 51. Field tubing 51, shown in dashed lines, is in communication with a supply, or source, of the flow of process gas (not shown) to deliver the flow to inlet port 45 of gas handling device 40. It should be understood that another length of field tubing 51 is generally coupled, via another fitting 62', to the spool piece 50 adjacent the device's outlet port 47. This second length of field tubing is in communication with the inlet of a semiconductor manufacturing device, or tool, to deliver the flow of gas thereto. Once spool piece 50 is coupled to field tubing 51, it is preferable that support 52 is repositioned along track 42 to support field tubing 51, as shown in FIG. 2 with support 52', which is shown in dashed lines. By positioning support 52' outwardly from the connection between spool piece 50 and field tubing 51, support 52' stabilizes the incoming and outgoing tubing from external stresses, thereby relieving stress on fitting 62'. This further reduces the likelihood of leaks and damage to the fittings and other elements of gas handling device 40.

Fittings 62, which interconnect gas handling units 44–48 and establish communication between the gas handling units, spool pieces 50 and field tubing 51, are preferably what are known as "zero-clearance" fittings because they do not require adjacent units to be disconnected in order to be disconnected or uncoupled from the particular lengths of piping or gas handling units to which they are coupled. Suitable fittings 62 are manufactured by The Swagelok® Companies of Solon, Ohio, and include male and female portions, which each include an internal gland and collectively receive and retain a gasket. The male and female portions unite to provide a secure, high purity connection.

Track 42 is shown in FIGS. 3 and 4. As shown, track 42 is elongate with a pair of opposed side walls 64, an upper structure 65 and a pair of opposed end walls 66. Track 42 further includes a pair of laterally spaced and longitudinally extending channels 68 separated by a spacer 69. Generally adjacent each end wall 66, spacer 69 includes an elongate slot 71, which extends generally parallel to and between channels 68. As shown, each slot extends inwardly from a respective one of end walls 66. The slots enable device 40 to be slidably and adjustably mounted in an operative position without requiring alteration to the track, as discussed subsequently. Although each channel 68 is shown in FIGS. 3 and 4 with a constant width, the regions of each channel adjacent end walls 66 may taper outwardly to be wider than the rest of the channel to provide an enlarged mouth to facilitate easier insertion and removal of elements, such as the subsequently described fasteners 76, into and from channels 68.

As shown, channels 68 each include an opening 70 extending along the length thereof. Openings 70 are narrower transverse to the long axis of track 42 than the corresponding body or interior region 72 of each channel 68. Another way of describing channels 68 is that they each have a pair of opposed flange-like projections 74 extending inwardly toward each other to define opening 70 with a narrower dimension transverse to the long axis of track 42 than the rest of the channel. Channels 68 provide a pair of parallel, generally T-shaped regions that cooperate to provide a race or guide along which the gas handling units and supports may be supported, adjusted along the length of, and selectively secured thereon. The dual, spaced-apart relationship of channels 68 constrains the mounted supports and gas handling units from rocking or otherwise shifting, thereby providing a secure, stable mount for gas handling units and supports.

By referring briefly back to FIG. 2, it can be seen that device 40 further includes a plurality of fasteners 76 and receivers 77 that enable the gas handling units and supports to slide, individually or as a unit, along track 42 without being unintentionally removed therefrom. Fasteners 76 and receivers 77 further enable the units and supports to be selectively secured in a defined position on track 42. Because track 42 enables the gas handling units and supports to be slidable and selectively securable thereon, they can be easily mounted, adjusted, readjusted, remounted, etc., as new units or supports are added to the device or as old units are removed for repair and replacement. In addition, the spaced-apart relationship of channels 68 enable a user to access and manipulate fasteners 76 and receivers 77 without disengaging or otherwise being limited by tubing mounting above and between channels 68, such as spool pieces 50 or the lengths of tubing extending from the inlet and exit ports of the gas handling units.

It should be understood that the gas handling units and/or supports are adjustably positioned and selectively mounted on track 42 without any alteration of the track, gas handling units or supports. By this it is meant that no mounting holes or other structural or particulate generating modifications need to be introduced to the track, units or supports after they are originally manufactured. This enables a user to quickly and freely adjust, service, maintain and replace components device 40 without having to worry about introducing particulate or other contaminants to the device or to the semiconductor manufacturing machine, or tool, with which the device is used. An additional benefit of being able to adjust the device without altering track 42, or the units and supports mounted thereon, is that the user can more frequently service or otherwise maintain the units because there is significantly less risk and time involved in removing and remounting the unit or support.

As shown in FIGS. 5–6, fasteners 76 include a first portion 78, which is configured to be inserted into one of channels 68 through opening 70 or through end wall 66, and a second portion 80, which extends outwardly from first portion 78 and is configured to secure a gas handling unit or support on track 42. Second portion 80 extends through at least a portion of the gas handling unit or support to be mounted on track 42. Each fastener 76 is rotatable between first and second positions. In the first position, shown in FIG. 6 with fastener **76*a*, first portion 78 may be selectively inserted through and removed from opening 70 to mount or remove a gas handling unit or support from track 42. In the second position, shown in FIG. 6 with fastener 76*b*, first portion 78 is retained within channel 68 and unable to pass through opening 70**. Examples of suitable fasteners are machine screws.

As shown in FIGS. 5 and 6, the first portion 78, or head, of each fastener 76 has a generally rectangular shape, with one pair of opposing corners shaved off or otherwise removed to leave an arcuate or other angular region 82. Region 82 enables fastener 76 to rotate only approximately one quarter turn, or 90 degrees, from its first position to its second position. After rotating fastener 76 to its second position in the direction indicated with an arrow in FIG. 6, the non-removed corner regions 84 engage the side walls of the corresponding channel, thereby preventing fastener 76 from further rotation. It should be understood that other configurations for region 82 are possible which enable the above-described rotation-limited construction, although a generally arcuate configuration is preferred because the first portion can be sized to more thoroughly constrain the fastener from rocking transverse to the long axis of track 42 even prior to a gas handling unit or support being secured thereon.

Because first portion 78 has a cross-sectional dimension in its first position, measured transverse to the long axes of track 42 and of the second portion 80, that is no greater than the corresponding cross-sectional dimension of opening 70, fastener 76 can be inserted or "dropped" into either of channels 68 regardless of whether there are gas handling units mounted in fixed positions on either side of the intended mounting position. Therefore, units or supports between the intended mounting position on track 42 and either end wall 66 of the track do not have to be removed from track 42 in order to mount a new unit or support onto the track. Instead, existing units or supports on either side of the intended mounting position are loosened from their mounting position so that they are slidable with respect to the track. After disconnecting the fitting joining the units to be moved with the other units mounted on the track, the loosened units are slid to their new mounting position, the new unit is added, and the units are reconnected with the gas conduit assembly via fittings 62.

To selectively secure fastener 76 in a defined position along channel 68, receiver 77, such as a bolt or other suitable securing mechanism, is threaded onto the fastener's second portion 80 distal first portion 78 and is tightened to draw the first portion into engagement with the pair of projections 74 defining opening 70, as shown for illustrative purposes in FIG. 6. It should be understood that in operation a support 52 or mounting block 57 should be mounted on fastener 76 prior to attaching receiver 77, and that the assembly shown in FIG. 6 with fastener **76*b* is shown to illustrate the relative position of the fastener's first portion 78 before and after engagement with receiver 77. Once receiver 77 is coupled to a fastener in its second position, the fastener and any support or gas handling unit mounted therebetween is slidable along the length of track 42 but is prevented from being outwardly displaced away from track 42. In essence, the unit or support is maintained above the top surface of the track within a bounds defined by the extent to which receiver is threaded along the length of the fastener's second portion 80**.

Once receiver 77 secures the fastener and unit or support in a defined position on track 42 by drawing the fastener's first portion into engagement with projections 74, the fastener not only cannot rotate within channel 68, but also is no longer slidable within the channel, at least until the fastener is at least partially released by the receiver. Because the first portion of fasteners 76 can be dropped into channels 68 through openings 70 and thereafter rotated to engage the side walls of channel 68, device 40 eliminates the need for a user to have to access the lateral or bottom regions of track 42. Whereas prior art devices required a user to position and engage a nut and bolt assembly above and below the base plate on which a gas handling unit was to be mounted, device 40 enables the user to install, adjust and remove units and supports from track 42 simply by having access to the region generally above track 42.

In FIG. 7, a gas handling unit, namely diaphragm valve 48, is shown mounted on track 42. Valve 48 includes body portion 55 and mounting block 57 that is secured in a defined position on the upper surface 65 of track 42 and maintained thereon by a pair of fasteners 76 and a corresponding pair of receivers 77. As discussed, the dual, spaced-apart mounts securing valve 48 on track 42 prevent the valve from rocking or otherwise shifting once the fasteners and receivers are brought into secure engagement with each other. Once loosened, however, valve 48 may be adjusted or slid along track 42, while at all times being prevented from being drawn away from upper surface 65 beyond the range defined by the fasteners and receivers.

In FIG. 8, a portion of diaphragm valve 48 is removed to show details of internal construction, and specifically, how mounting body portion 55 is mounted on mounting block 57. As shown, gas handling unit 48 includes a pair of internal mounting holes 59 that extend from mounting surface 56, through mounting block 57 and into body portion 55 of the gas handling unit. A screw 61 is threadedly received within each hole 59 to secure mounting block 57 to body portion 55. As shown, each hole 59 varies in diameter, having a relatively wide first region 63 through which the entire screw may pass, and a second, narrower region 65 through which only the shaft of the screw may pass. First region 63 enables the entire screw to be maintained above mounting surface 56 so that it does not interfere with the slidable movement of the gas handling unit along track 42. By referring briefly back to FIG. 2, one can see that gas handling units 44 and 46 also contain mounting blocks 57, and it should be understood that the mounting blocks are secured to each unit's body portion 55 as described above.

Figure 9:
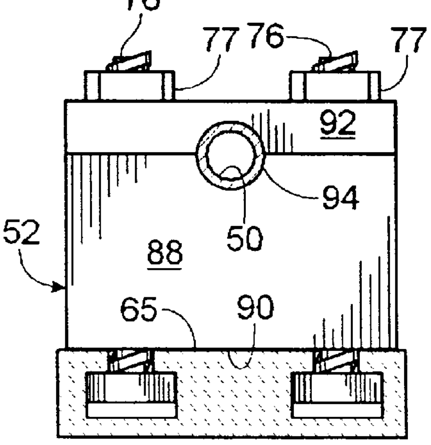
FIG. 9 is a cross-sectional view taken along the line 9—9 in FIG. 2 and showing a support for the spool piece mounted on the track.

In FIG. 9, support, or tube mounting block, 52 is shown mounted in a fixed position on track 42. Support 52 includes a base 88 which has a mounting surface 90 that engages upper surface 65 of track 42, and a cover 92 that is mounted on base 88 distal track 42. Base 88 and cover 92 collectively define an aperture 94 through which a portion of spool piece 50 is passed. Base 88 supports the portion of spool piece 50 a defined distance above track 42, while cover 92 prevents the portion of spool piece 50 from being bent or otherwise displaced outwardly further than the distance defined by base 88. Supports 52 are commonly mounted generally adjacent each end wall 66 of track 42 to support spool piece 50 at each end of the device.

Because the distance at which spool piece 50 is mounted above track 42 and the length of track 42 are known, they can be established as standardized dimensions. In addition, the distance between the ends of spool pieces 51 may also be standardized. Therefore it is now possible for an installer of piping to completely install the necessary field tubing 51 to deliver a flow of gas to device 40 directly or indirectly from a supply or other source of gas, as well as the necessary field tubing 51 to transport the flow of gas from device 40 to the inlet of the semiconductor manufacturing device, or tool, with which device 40 is used. This significantly reduces the time and expense to install a semiconductor manufacturing device, including the requisite gas handling devices and units, because the tubing can be installed in a single step, with a gap, equal to the end-to-end distance between the ends of the field tubing, left above a mounting surface that is at least as long as the end-to-end length of track 42. Furthermore, because the heights of the installed gas handling units, supports and spool pieces are known, the ends of the installed field tubing adjacent the gap may be secured in an elevated position equal to this height. Gas handling device 40 can simply be positioned within the gap, secured in an operative position (as discussed subsequently) and connected to the tubing adjacent each end of the gap.

An additional advantage of device 40 having a standardized length, such as twelve, eighteen or twenty-four inches, and a standardized height at which gas handling units and supports are positioned, is that the devices may be mass produced. This enables the devices to be assembled in a clean room or other sterilized environment by workers wearing clothing and protective items selected to minimize the likelihood of particulate or other contaminants from being introduced into the devices. Once assembled, the units can be tested for operability, cleanliness and the absence of leaks, and then subsequently sealed in a protective enclosure and stored until needed.

Figure 1:
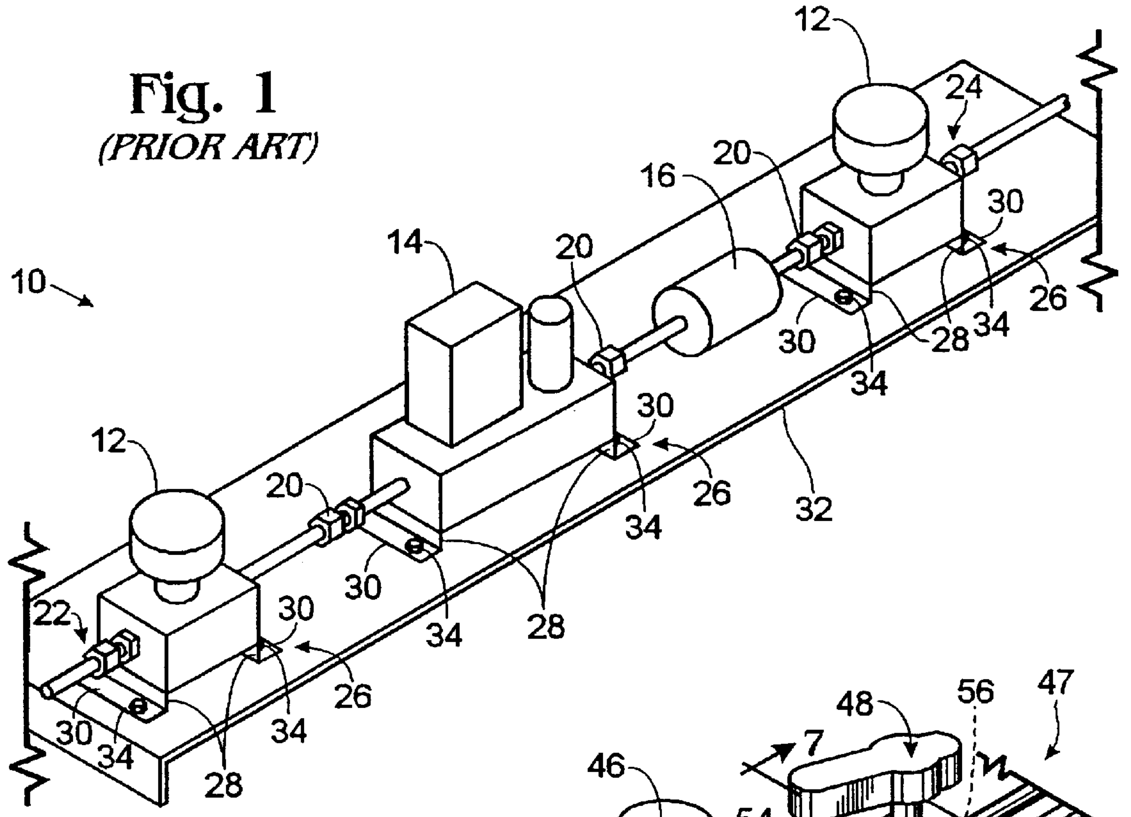
FIG. 1 is an isometric view showing a prior art gas handling device that includes a plurality of gas handling units mounted in fixed positions on a rigid base plate.

A further advantage of having pre-assembled devices with specific combinations of gas handling units mounted thereon is evident when an installed device needs to be repaired or otherwise serviced. Because the devices may be pre-assembled and stored in a sterile, protected environment, the installed device can be removed from its operative position as a single unit and replaced with a gas handling device of the same size and with the same or similar gas handling units with minimum amount of time and effort. This is particularly significant because it dramatically reduces the tool's downtime, compared to the time it would take a user to remove the prior art device shown in FIG. 1, assemble a replacement device, and install the replacement device.

To install device 40 in an operative position for use with a tool used in the semiconductor manufacturing process, device 40 is commonly mounted in a variety of positions adjacent or proximate the unit. Device 40 may be mounted within or on the tool, however it is commonly mounted separate from the tool. For example, when the tool is located in a room with a raised or false floor, gas handling devices 40 are commonly adjustably and removably mounted on struts extending between adjacent supports or stanchions that support the raised floor.

Regardless of its operative position, device 40 is able to be mounted as a unit without requiring alteration of the device. The slots essentially provide a pair of adjustable mounts through which the device can be adjustably mounted in an operative position and selectively secured as a unit thereon. Slots 71 are each configured to receive a mount, such as a bolt or other suitable securing device, which can be inserted through one of the slots and retained thereon. The elongate length of slots 71 enable a user to initially position device 40 proximate its operative position and pass a mount through each slot. Once initially positioned, device 40 can be adjusted to a proper mounting position by sliding the track with respect to the mounts, which remain positioned within and slide with respect to slots 71. After the device is in a desired operating position, the mounts, such as a pair of bolts, are removably secured with respect to the device, such as with a pair of nuts. To remove device 40, the nuts are loosened or removed from the mounts, and the device is removed from engagement with the mounts.

To install gas handling device 40 in an operative position within a gap between opposing lengths of field tubing 51, the device is initially positioned so that the outward ends of spool pieces 50 are generally aligned with the ends of field tubing 51 that define the gap. Because the distance the outward ends of the spool pieces is known, because of the standardization of length made possible by this invention, the gap should be equal to this distance. It should be understood, however, that if the gap is too long or too short, one or both of spool pieces 50 can be removed and replaced with a spool piece sized to span the distance between the end of field tubing 51 and the gas handling device proximate that end. Next, spool pieces 50 are coupled to the lengths of field tubing 51 via fittings 62. After this step, track 42 is fastened in its present position by passing a pair of bolts through slots 71 and securing them thereon by a corresponding pair of nuts.

To prevent damage to the mechanical joint, namely fitting 62, between spool piece 50 and field tubing 51, it is preferred that support 52 is removed from its original, mass-produced position, where it supports spool piece 50 and prevents it from being bent or otherwise damaged during shipping and storage of device 40. Support 52 should be repositioned on track 42 so that it supports field tubing 51, as shown dashed lines in FIG. 2 with support 52'. As shown, support 52' and gas handling unit 44 cooperate to support both ends of connection between spool piece 50 and field tubing 51, and therefore substantially reduce the risk of fitting being damaged by external stresses or forces, which can cause process gas to leak from the damaged fitting.

Figure 10:
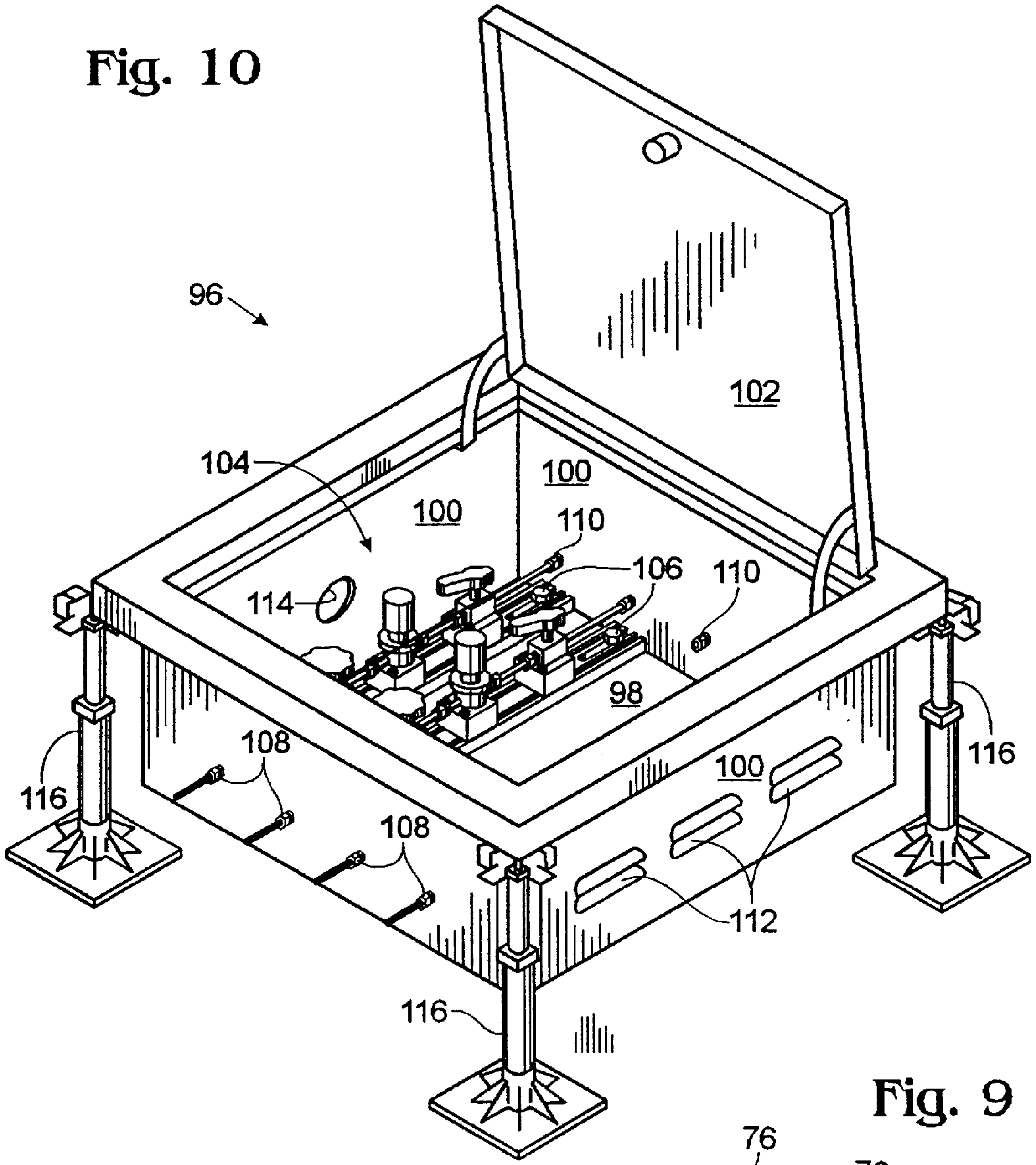
FIG. 10 is an isometric view of a pair of the gas handling devices shown in FIG. 2 mounted in a gas handling box.

When the invented gas handling device is used to control and regulate a flow of a harmful process gas, such as a toxic, flammable, corrosive or pyrophoric gas, device 40 is commonly mounted within a gas handling box, which is shown in FIG. 10 and indicated generally at 96. Box 96 is commonly referred to as a valve manifold box (VMB), gas isolation box (GIB), or a floor gas isolation box. Box 96 has a floor 98, side walls 100 and an upper surface 102, which collectively define an enclosure 104 into which at least one, and preferably several, gas handling devices are mounted. At least one of the surfaces defining enclosure 104, namely the floor, upper surface or side walls, should be selectively removable to permit access to enclosure 104. As shown in FIG. 10, the box's upper surface 102 includes a removable portal through which enclosure 104 may be accessed. Within enclosure 104, box 96 includes a plurality of mounts 106 on which gas handing devices 40 may be adjustably mounted as a unit without alteration of the device, as discussed above. As shown, only a single device 40 is mounted within enclosure 104, however box 96 is equipped to receive up to four gas handling devices, as indicated by the plurality of laterally spaced bulkhead fittings 108 and 110 through which process gases may be supplied to and removed from box 96. Bulkhead fittings 108 and 110 support the connection between spool piece 50 and field tubing 51. Therefore, supports 52 can be removed from the gas handling device 40 when it is mounted within a gas handing box. Alternatively, supports 52 can be retained in their original position, where they engage and support field tubing 50.

Box 96 further includes a plurality of vents 112 through which an air supply is drawn into enclosure 104, and an exhaust port 114 through which the air supply is vented. It should be understood that box 96, and specifically enclosure 104, is in communication with a fan which draws air into enclosure 104, through exhaust port 114 and to a scrubber or other suitable device for removing harmful elements from the air. Because all of the gas within enclosure 104 is removed through exhaust port 114, if any process gas leaks from device 40, it is drawn through the exhaust port and therefore would not endanger or potentially harm users adjacent the box. As shown in FIG. 10, box 96 is supported by a plurality of stanchions 116, which are commonly used to support raised floors, as discussed above.

Figure 11:
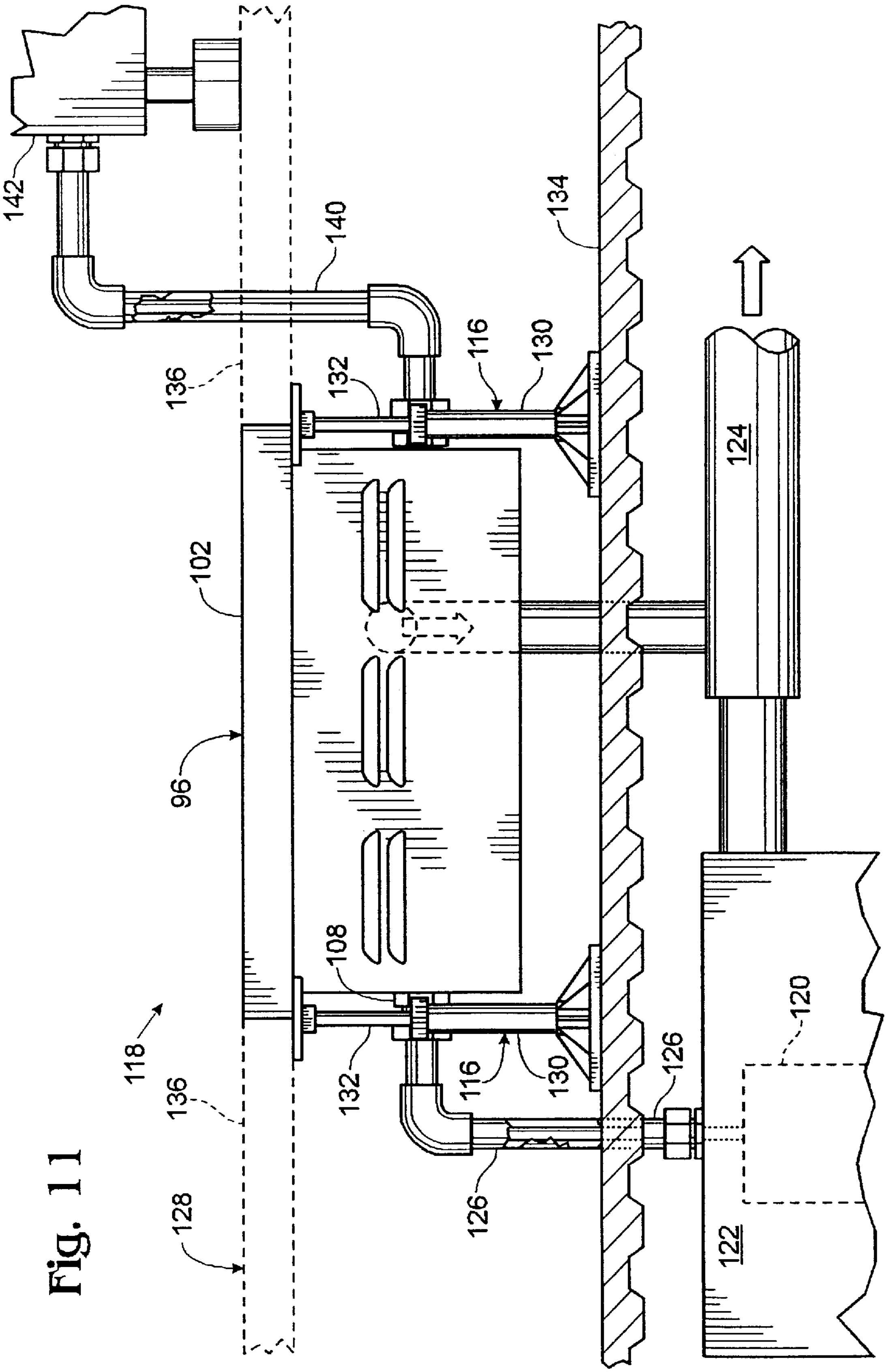
FIG. 11 is a schematic side elevation view showing the gas handling device and the gas handling box shown in FIG. 10 mounted in an operative position for use with a semiconductor manufacturing device.

FIG. 11 schematically illustrates an assembly for use in the semiconductor manufacturing process. Specifically, FIG. 11 illustrates an assembly, which is generally indicated at 118, that is adapted for use with a toxic or otherwise harmful or dangerous process gas. Assembly 118 includes a supply of process gas 120, which is housed in a vented cabinet 122 that is in communication with an exhaust duct 124. From cabinet 122, a length of double-walled piping 126 delivers a supply of process gas to one of the inlets 108 of gas handling box 96, which includes the previously described gas handling device. Box 96 is mounted on a plurality of stanchions 116 that support a raised floor 128. As shown, stanchions 116 include a base portion 130 and an adjustable upper portion 132, which cooperate to support raised floor 128 a defined distance above floor 134. It should be understood that each stanchion 116 normally supports a portion, namely the comers, of four floor tiles, two of which are generally indicated at 136 in dashed lines. Box 96 is installed by removing a selected tile 136 and inserting box 96 therefor, with the box's upper surface 102 being supported by stanchions 116 in the same manner as tile 136.

After the flow of gas is delivered to the gas handling units housed within box 96, the flow of gas is delivered through the box's outlet 110 to a second length of double-walled piping 140, which is in communication with a tool 142 used in the semiconductor manufacturing process. Box 96 and cabinet 122 are in communication with exhaust duct 124, through which any gas which escapes from supply 120, piping 126 and 140, or the previously described gas handling device is drawn and transported to a scrubber or other suitable disposal or purification device.

It should be understood that an assembly configured for use with an inert or non-hazardous gas would be similar to assembly 118, except the lengths of piping would not need to be double-walled piping, and that the supply of process gas and the gas handling devices would not need to be housed in externally vented enclosures. Instead, the invented gas handling device is adjustably mounted on a pair of rails or supports that are coupled between adjacent stanchions 116. Each rail extends transverse to the long axis of device's track and includes a mount or bolt which extends therefrom for insertion through a respective one of track 42's slots 71.

While the present invention has been shown and described with reference to the foregoing preferred embodiment, it is to be understood by those of skill in the art that other changes in form and detail may be made therein without departing from the spirit and scope of the invention as defined in the following claims.

What is claimed is:

1. A method for mounting gas handling units on a gas handling device, without requiring alteration of the device or the gas handling units, to provide and regulate a flow of gas to a semiconductor manufacturing apparatus having an inlet for receiving the flow of gas, the method comprising:

providing a gas handling device having an elongate track including a pair of laterally spaced and longitudinally extending channels with openings extending along a substantial portion of the length thereof and a plurality of gas handling units each having an inlet port, an outlet port and a mounting surface;

slidably engaging a first one of the plurality of gas handling units on the track, wherein the mounting surface of the gas handling unit engages and is slidable along the track;

securing the first gas handling unit in a desired position on the track without requiring alteration of the track or the gas handling unit;

slidably engaging a second one of the plurality of gas handling units on the track in a spaced-apart relationship to the first gas handling unit, wherein the mounting surface of the second gas handling unit engages and is slidable along the track;

establishing communication between the inlet port of the first gas handling unit with the outlet port of the second gas handling unit; and securing the second gas handling unit in a second desired position on the track without requiring alteration of the track or the second gas handling unit.

2. The method of claim 1, further including the step of providing a plurality of fasteners, each fastener having a first portion configured to engage and be selectively retained within a respective one of the channels and a second portion configured to extend from the channel and through the corresponding opening to engage one of the plurality of gas handling units, wherein the engaging steps include receiving the first portion of a fastener within the channel so that the second portion extends through the opening and engages the respective gas handing unit.

3. The method of claim 2, wherein the providing step further includes providing a plurality of receivers that are each configured to engage the second portions of plurality of fasteners, and further wherein the securing steps further include engaging the second portion with a receiver for securing the unit in a defined position on the track.

4. The method of claim 1, wherein the channels each have a generally T-shaped cross-sectional configuration.

5. The method of claim 1, wherein the plurality of gas handling units are selected from at least two of the group consisting of valves, filters, flow controllers, pressure regulators, pressure indicators and pressure transducers.

6. The method of claim 1, wherein the method further includes the step of repeating the engaging, securing and coupling steps a plurality of times to position, mount and secure a desired number of gas handling units on the track and in communication with each other.

7. The method of claim 1, wherein the providing step includes providing a gas handling box having an internal chamber with an exhaust system, and further wherein the method includes the step of mounting the device within the box.

8. The method of claim 7, wherein the box further includes a pair of spaced-apart mounts, and the method further includes the step of engaging each of the slots in the device with a respective one of the mounts to position the device within the box.

9. The method of claim 8, wherein the method further includes the steps of adjustably positioning the device with respect to the mounts to position the device in a desired operative position, and securing the device in the desired operative position.

10. The method of claim 1 adapted to establish communication between the plurality of gas handling units and a pair of lengths of field tubing, wherein the providing step includes providing a pair of spool pieces, and wherein the method further includes coupling each of the spool pieces to a respective one of the plurality of the gas handling units and to a respective one of the pair of lengths of field tubing.

11. The method of claim 10, wherein the providing step further includes providing a pair of supports, each support slidably and adjustably mounted on the track to support a respective one of the pair of lengths of field tubing.

12. A method for inserting a gas handling unit onto a gas handling device having an elongate track with a pair of laterally spaced and longitudinally extending channels, a pair of gas handling units having inlet ports and outlet ports and which are each mounted on the track by a pair of fasteners that are each partially received within a respective one of the channels and are each secured to the unit by a receiver, and a fitting coupling and establishing communication between the inlet port of a first of the pair of gas handling units with the outlet port of the other gas handling unit, the method comprising:

uncoupling the fitting establishing communication between the pair of gas handling units;

selecting either of the pair of gas handling units to be repositioned on the track;

at least partially disconnecting the receivers on the selected unit to enable the selected unit to be slidable along the track;

sliding the selected unit away from the other gas handling unit to define a mounting position between the selected unit and the other unit;

inserting a pair of fasteners into the track, wherein one fastener is inserted into each of the channels within the mounting position without requiring alteration of the track or the fasteners;

mounting a third gas handling unit onto the pair of fasteners, wherein the third gas handling unit has an inlet port and an exit port;

establishing communication between one of the ports of the third gas handling unit to one of the ports of the other unit;

securing the third gas handling unit in a defined position on the track without requiring alteration of the track or the third gas handling unit;

sliding the selected unit toward the third gas handling unit and into a second defined position on the track;

establishing communication between the other port of the third gas handling unit to the selected gas handling unit; and securing the selected gas handling unit in the second defined position without requiring alteration of the track or the selected unit.

13. A gas-handling device, comprising:

an elongate track having a first surface and a pair of laterally spaced and longitudinally extending channels extending along the length of the track, each channel including an opening extending along at least a substantial portion of the length thereof; and a plurality of gas handling units mounted on the track and in communication with each other, each of the plurality of gas handling units having a fastener configured to have a first position and an second position at least partially received within each of the channels, an inlet port and an outlet port, and each unit configured to be slidable with respect to the track and selectively secured in a defined position thereon;

wherein each of the plurality of gas handling units may be removed from the track by switching the fastener to the first position.

14. The gas handling device of claim 13, wherein the opening of each channel has a cross-sectional dimension transverse to the long axis of the track that is smaller than the corresponding cross-sectional dimension of the channel transverse to the long axis of the track.

15. The gas handling device of claim 13, further including a pair of spool pieces of tubing in communication with the plurality of gas handling units to deliver and remove a flow of gas to and from the plurality of gas handling units.

16. The gas handling device of claim 15, wherein each of the pair of spool pieces extends generally between the channels and above the track.

17. The gas handling device of claim 15, wherein each of the pair of spool pieces is supported by a support that is slidably and adjustably mounted on the track.

18. The gas handling device of claim 15, wherein each of the spool pieces is configured to be coupled to a length of field tubing to establish communication between the field tubing and the plurality of gas handling units.

19. The gas handling device of claim 13, wherein the plurality of gas handling units are slidable along the length of the track and selectively securable thereon without alteration to the units or the track.

20. The gas handling device of claim 13, wherein each of the channels has a generally T-shaped cross-sectional configuration transverse to its long axis.

21. The gas handling device of claim 13, wherein the track further includes a spacer extending between the channels to maintain the channels in a spaced-apart, parallel relationship.

22. The gas handling device of claim 13, wherein the fastener includes a pair of rotatable members that are each received within a respective one of the channels and are each rotatable from a first position in which the fastener may be inserted through and removed from the opening to mount or remove the unit from the track, and a second position in which the fastener is retained within the channel and unable to pass through the opening.

23. The gas handling device of claim 22, wherein the cross-sectional dimension of each of the rotatable members transverse to the long axis of the track in the first position is not greater than the corresponding cross-sectional dimension of the opening transverse to the long axis of the track, and further wherein the cross-sectional dimension of the rotatable members transverse to the long axis of the track in the second position is larger than the corresponding cross-sectional dimension of the opening transverse to the long axis of the track.

24. The gas handling device of claim 13, wherein the fastener has a first portion received and selectively secured within a respective one of the channels and a second portion extending from the first portion, through the opening in the channel and through at least a portion of the unit, the fastener enabling the unit to be slidable along the track and selectively securable thereon without requiring alteration to the track or the gas handling unit.

25. The gas handling device of claim 24, wherein each unit further includes a receiver coupled to the fastener to selectively retain the unit in a selected position on the track.

26. The gas handling device of claim 13, wherein the track includes a pair of opposed end regions extending generally transverse to the channels and a pair of slots adjacent each end region for receiving a mount to secure the device in an operative position.

27. The gas handling device of claim 26, wherein each slot extends inwardly from a respective one of the end regions and further extends generally parallel to the track to enable the device to be adjustably positioned with respect to the mounts and selectively secured thereon without requiring alteration to the device or the mounts.

28. The gas handling device of claim 13, wherein the plurality of gas handling units are selected from at least two of the group consisting of filters, valves, pressure transducers, pressure regulators, pressure indicators and flow controllers.

29. The gas handling device of claim 13, wherein each of the channels includes a pair of end regions with a width that is wider than the width of the channel between the end regions.

30. A gas handling device for regulating and controlling a flow of process gas to a semiconductor manufacturing apparatus, the device comprising:

a gas handling box having an internal chamber with an exhaust system;

an elongate track mounted within the chamber, wherein the track has a first surface and a pair of laterally spaced and longitudinally extending channels extending along the length of the track, each channel having an opening defined in the first surface that has a cross-sectional dimension transverse to the long axis of the track that is smaller than the corresponding cross-sectional dimension of the channel transverse to the long axis of the track; and a plurality of gas handling units mounted on the track and in communication with each other, each of the plurality of gas handling units having a portion at least partially received within each of the channels, an inlet port and an outlet port, and each unit configured to be slidable with respect to the track and selectively secured in a defined position thereon.

31. The gas handling device of claim 30, wherein the box further includes a pair of bulkhead fittings for establishing communication between the chamber and lengths of field tubing outside of the chamber, and wherein the gas handling device further includes a pair of spool pieces, each spool piece coupled to a respective one of the plurality of gas handling units and a respective one of the bulkhead fittings.

32. The device of claim 30, wherein the track includes a pair of end regions and a pair of elongate slots extending inwardly from a respective one of the end regions, the box further includes a pair of spaced-apart mounts within the chamber, and each mount is configured to be adjustably received within a respective one of the slots to secure the track in an operative position with the box.

33. The device of claim 32, wherein the mounts extend through the slots and enable the track to be adjustably mounted with respect to the mounts without requiring alteration of the track or the mounts.

34. An assembly for use in processing semiconductor devices, comprising:

a semiconductor manufacturing apparatus having an inlet for receiving a flow of gas; and a gas handling device having an inlet in communication with a supply of the flow of gas and an outlet in communication with the inlet of the semiconductor manufacturing apparatus, wherein the device further comprises:

an elongate track having a first surface and a pair of laterally spaced and longitudinally extending channels extending generally along the length of the track, each channel having an opening defined in the first surface that has a cross-sectional dimension transverse to the long axis of the track that is smaller than the corresponding cross-sectional dimension of the channel transverse to the long axis of the track; and a plurality of gas handling units mounted on the track and having a portion at least partially received within each of the channels, each unit having an inlet port and an outlet port, and each unit configured to be slidable with respect to the track and selectively secured in a defined position thereon.

35. The assembly of claim 34, wherein the plurality of gas handling units are slidable along the length of the track and selectively securable thereon without alteration to the units or the track.

36. The assembly of claim 34, wherein each of the channels has a generally T-shaped cross-sectional configuration transverse to its long axis.

37. The assembly of claim 34, wherein the plurality of gas handling units are selected from at least two of the group consisting of filters, valves, pressure transducers, pressure regulators, pressure indicators and flow controllers.

* * * * *